United States Patent [19]

Bi

[11] Patent Number: 5,483,236
[45] Date of Patent: Jan. 9, 1996

[54] METHOD AND APPARATUS FOR A REDUCED ITERATION DECODER

[75] Inventor: Qi Bi, Morris Plains, N.J.

[73] Assignee: AT&T Corp., Murray Hill, N.J.

[21] Appl. No.: 169,939

[22] Filed: Dec. 20, 1993

[51] Int. Cl.$^6$ .................................................. H03M 13/00
[52] U.S. Cl. ................................................................ 341/94
[58] Field of Search .................................. 341/94; 371/37, 371/38, 39, 40

[56] References Cited

U.S. PATENT DOCUMENTS

| 4,498,175 | 2/1985 | Nagumo et al. | 371/37 |
| 4,845,713 | 7/1989 | Zook | 371/37 |

*Primary Examiner*—Brian K. Young
*Attorney, Agent, or Firm*—Robert E. Rudnick

[57] ABSTRACT

The present invention is a reduced iteration decoder circuit and method to compute error-locator sequence values for use in the correction of bit errors in Reed-Solomon or BCH coded information. By utilizing special properties of Reed-Solomon code and BCH codes, the decoder circuit of the present invention can detect n symbol errors using approximately n mathematical iterations with substantially reduced decoding processing time. A further reduction of decoding time is achieved by the performance of a substantial portion of the decoding processing in a parallel manner. The present invention may be utilized in digital communication systems and data storage systems or other information systems where Reed-Solomon or BCH encoding is utilized.

29 Claims, 5 Drawing Sheets

METHOD AND APPARATUS FOR A REDUCED ITERATION DECODER

FIELD OF THE INVENTION

The present invention relates to decoders capable of bit-error correction in stored or transmitted digital information and in particular to decoders of information encoded with BCH or Reed-Solomon code.

BACKGROUND OF THE INVENTION

A typical digital communication system consists of a transmitter, a transmission channel and a destination receiver. In operation, the transmitter transmits digital information from an information source over the transmission channel to the receiver. Noise, interference and distortion in the transmission channel affect the transmitted information and may cause bit errors in the information received at the destination receiver.

Various encoding techniques or codes have been employed in communication systems to minimize the effects of noise, interference and distortion. These encoding techniques enable the detection and correction of a predetermined maximum number of bit errors by adding parity data to the transmitted information. Block coding and convolutional coding are two types of coding in common use today for the transmission of digital information.

An encoder employing block coding divides the information sequence into discrete message blocks containing k information bits. The encoder generates a parity bit sequence of r bits based on the information contained in each message block. The encoder then sends each message block and corresponding parity bit sequence in a code word of N-bits, where the value N=r+k. Since the N-bit code word is generated based solely on the information in the corresponding k-bit message block, the block code encoder can be implemented using a combinational logic circuit. A general description of the block coding technique is provided in Lin, S. and Costello, Jr., D. J., *Error Control Coding: Fundamentals and Applications,* Chap. 3, pp. 51–84 (Prentice Hall, 1986) ("Lin and Costello"). This reference and other references mentioned in this specification are incorporated herein by reference.

An encoder utilizing convolutional codes also operates on k-bit long message blocks and generates a sequence of r parity bits to produce a corresponding code word of N-bits in length. However, the parity bits of each code word depend not only on the information in that particular k-bit message block, but also the information contained in a number of previously transmitted code words. Since the convolutional code encoder requires some means to maintain a history of the transmitted code words, it may be implemented using a sequential logic circuit. Typical convolutional coding techniques and implementations are provided in Lin and Costello, Chap. 10, pp. 287–314.

In cellular telecommunication systems, convolutional codes are the more commonly used encoding technique. Since fading of the digital signals in the cellular transmission channel occurs relatively rapidly, bit errors produced in the received information, typically occur in bursts. Although convolutional codes are a poor encoding technique for correcting bursts of bit errors because of the long decoding processing time that is required to correct such errors, reasonable decoding times can be achieved by interleaving the cellular information to be encoded.

The interleaving or scrambling of the information sufficiently randomizes the bit errors, and thus, removes the burst nature of these errors to enable convolutional coding to be an effective and practical coding method in detection and cellular telecommunication applications. An efficient decoding method for convolutional codes is the Viterbi algorithm. The Viterbi algorithm is described in detail in Blahut, R. G., *Theory and Practice of Error Control Codes,* Chap. 12.8, pp. 377–382 (Addison-Wesley Pub. Co. 1983) ("Blahut").

However, in certain applications, such as Personal Communications Systems or PCS, the fading of the transmitted information over a transmission channel is much slower than that of the cellular telecommunication systems. As a consequence, the burst nature of the bit errors generated in a PCS channel may not be effectively removed through the use of interleaving the information. Thus, convolutional coding may not be a desirable technique for bit error correction in PCS systems.

Reed-Solomon code is a form of block code which is commonly used to improve transmission quality of transmitted information and is particularly effective in correcting bit errors that occur in bursts. The Berlekamp-Massey algorithm, a commonly used method to decoding Reed-Solomon code, requires 2 n mathematical iterations to identify and correct a total of n symbol errors in the information message, where the number of errors n is less than or equal to the maximum number of errors the particular Reed-Solomon code system was designed to correct.

However, the mathematical iterations of the Berlekamp-Massey algorithm must be performed in a sequential fashion because the computation of a discrepancy value $\Delta_r$ in each iteration is dependent upon the completed computation of the discrepancy value $\Delta_r$ for the previous iteration. Further, the computation of each discrepancy value $\Delta_r$ involves a complex and time consuming polynomial to polynomial multiplication.

An alternative prior art decoding technique for Reed-Solomon code utilizes solving a matrix inverse of the Peterson-Gorenstein-Zierler equation which requires an impractical and relatively slow $n^3$ mathematical iterations. A general description of the Peterson-Gorenstein-Zierler equation, as well as, the Berlekamp-Massey algorithm, is provided in Blahut, Chaps. 7.2 and 7.5, pp. 166–173 and 183–191, respectively.

As the desire to send information at higher bit rates with greater error correction capabilities increases, a need to decode information at a substantially faster rate has arisen.

SUMMARY OF THE INVENTION

An object of the present invention is to provide a decoder with reduced processing delay and computational complexity. Another object of the present invention is to provide a decoding technique for the transmission of digital voice signals in a communication system with improved voice quality at a destination receiver which does not require a substantial amount of echo cancellation circuitry.

The present invention is an improved circuit and method for decoding transmitted or stored Reed-Solomon or Bose, Chaudhuri and Hocquenghem (BCH) coded information. The present invention utilizes an algorithm incorporating special properties of Reed-Solomon and BCH codes in a circuit that requires only approximately n computational iterations to detect and correct the presence of n symbol errors. Although this circuit and method requires the computation of two discrepancy values in each iteration, each iteration is of lesser computational complexity than the iterations typical of prior art decoders.

A further reduction of decoding time is achieved in the present invention by employing a decoding technique which generates the two discrepancy or error values of each iteration in a parallel fashion. As a consequence of the reduced decoding processing delay in the present invention, the complexity and cost of the decoder circuit will be reduced and the burden on any associated echo cancellation circuitry will be diminished.

DETAILED DESCRIPTION

Figure 1:
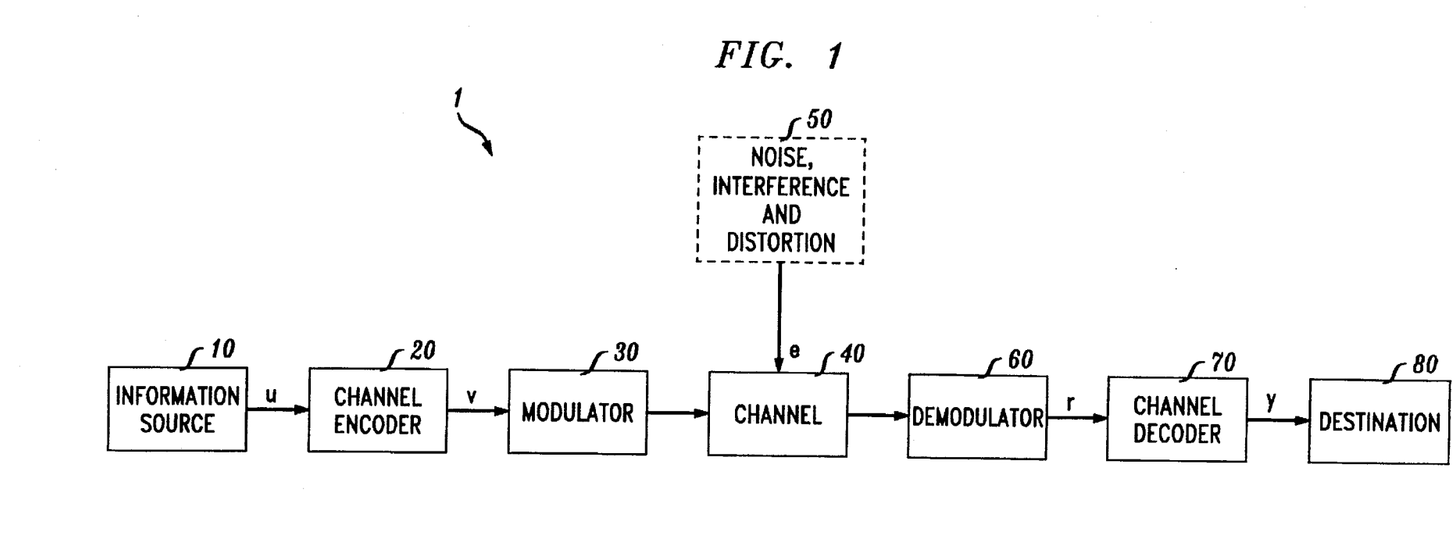
FIG. 1 is a schematic illustration of a communication system utilizing a channel decoder according to the present invention.

A communication system 1 employing the decoding circuit and method of the present invention is shown in FIG. 1. An information source 10 provides a source information sequence u to a channel encoder 20. The source information sequence u is a digital signal which may be derived from an analog source, such as voice communications, by using an analog-to-digital converter. The channel encoder 20 transforms the source information sequence u into discrete encoded sequences or information blocks v using Reed-Solomon code. The resulting information blocks v may also be binary digital sequences. Although FIG. 1 depicts a communication system 1 employing Reed-Solomon encoding, it would be readily apparent to those skilled in the art that a communication system according to the present invention could be constructed in a similar manner utilizing BCH encoding.

A modulator 30 transforms each information block v received from the channel encoder 20 into a signal for transmission on a transmission channel 40. Suitable transmission channels for transmission channel 40 include telephone lines, high-frequency radio links, telemetry links, microwave links, satellite links and the like. The waveforms transmitted through the transmission channel are acted upon, and corrupted by, noise, interference and distortion e as represented by block 50 in FIG. 1. For example, on a telephone line, the interference may come from switching impulse noise, thermal noise, crosstalk from other telephone lines or lightning.

A demodulator 60 receives the corrupted waveforms from the transmission channel 40 and processes each received waveform to produce a digital output sequence or received sequence r. The received sequence r corresponds to the encoded information blocks v generated by the channel encoder 20 containing possible bit errors caused by the noise, interference and distortion e.

The received sequence r is provided to a channel decoder 70 which processes it to detect and correct any bit errors. The resulting signal generated by the channel decoder 70 is a decoded sequence y. The decoded sequence y will be identical to the information sequence u generated by the information source 10 if the number of errors caused in the transmission channel 40 was less than or equal to the maximum number of errors that the particular Reed-Solomon code system was designed to correct. The decoded sequence y is then provided to a destination receiver 80.

The channel encoder 20 of the communication system 1 of FIG. 1 and its associated components utilize Reed-Solomon code to maintain a sufficient level of transmission quality. Reed-Solomon code, which is a special form of BCH code, is based on information blocks consisting of N symbols, wherein each symbol contains M bits. In Reed-Solomon code, the relationship of the number of bits per symbol M and the number of symbols per information block N are usually selected to satisfy the expression: $N=2^M-1$. For example, when a coding system is designed with four bits per symbol, i.e., M=4, the number of symbols per information block N may be 15, i.e., $2^4-1$.

In a Reed-Solomon code system, such as the communication system 1 of FIG. 1, a channel decoder can detect and correct a maximum of t symbol errors when 2 t symbols in each of the transmitted code words or information blocks are reserved for parity information. For example, in order to detect and correct a maximum of two symbol errors, four symbols, i.e., 2(2), must be reserved as parity symbols.

Thus, if the communication system 1 employed the coding scheme described above, the channel encoder 20 would divide the received information sequence u into message block sequences of eleven symbols of four bits each. The channel encoder 20 would also generate the corresponding four symbol parity sequences based on the information contained in each of the eleven symbol message block sequences. The resulting transmitted code words or information blocks would consist of 15 symbols comprising eleven message block symbols and four parity symbols.

Reed-Solomon code systems have the advantageous feature of being able to efficiently correct bit errors occurring in bursts because the coding technique is based on correcting symbol errors, independent of whether one or all of the bits of a particular symbol are incorrect. Thus, the coding system described above which is able to correct two symbol errors can correct a maximum of eight bit errors in an information block if they all occur within two symbols.

Suitable methods for constructing Reed-Solomon type channel encoders, such as channel encoder 20 of FIG. 1, are described in Lin and Costello, Chap. 6.5, pp. 170–178. In addition, modulator and demodulator designs for the transmission and reception of data over different channels for use as the modulator 30 and the demodulator 60 are well known in the art.

Figure 2:
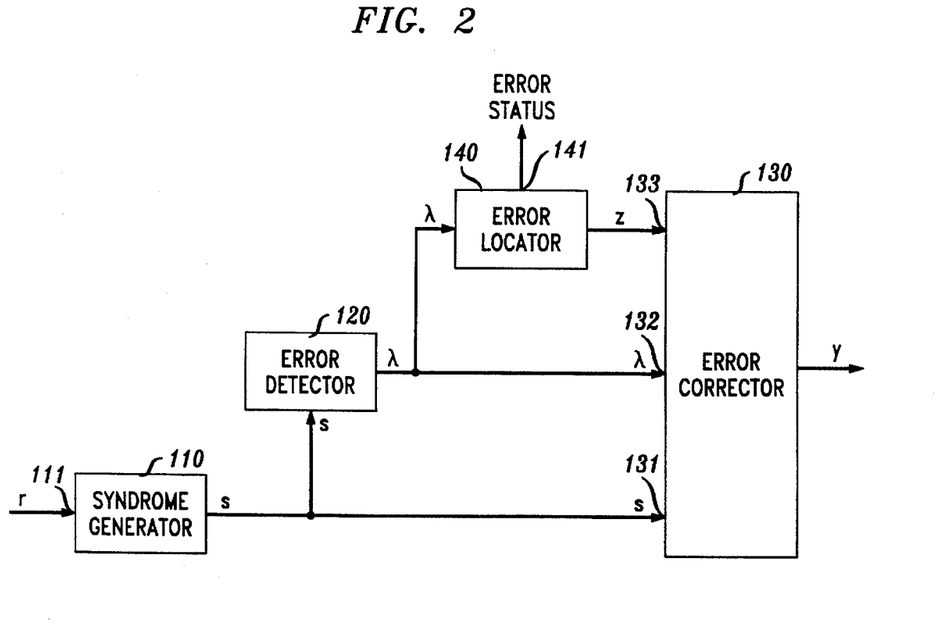
FIG. 2 is a schematic illustration of the decoder circuit in the communication system of FIG. 1.

Details of one suitable channel decoder 70 according to the present invention are illustrated in FIG. 2. The received sequence r generated by the demodulator 60 of FIG. 1 is applied to an input 111 of a syndrome generator 110. The syndrome generator 110 generates a signal s corresponding to a computed sequence of syndrome values based on the received sequence r. The signal s is applied to a reduced-iteration error-detector 120 and a first input 131 of an error-corrector 130. The error-detector 120 generates an error signal λ corresponding to an error-locator sequence Λ computed by a reduced iteration technique according to the present invention and is discussed further below in connection with FIG. 3. The error signal λ is applied to an error-locator 140 and a second input 132 of the error-corrector 130.

The error-locator 140 locates the positions of symbol errors within a corresponding information based on the information in the error signal λ. The error-locator 140 generates a signal z based on the determined positions of the symbol errors. The generated signal z is applied to a third input 133 of the error-corrector 130. The error-locator 140 also has an error status output 141.

The error-corrector 130 determines the proper values for the incorrect symbol errors at the identified locations in the corresponding information block based on the signals at its inputs 131–133 and generates a corresponding decoded signal y. The decoded signal y corresponds to the signal u provided by the information source 10 in FIG. 1. In addition, if the number of symbol errors detected by the error-locator 140 is greater than the maximum number of correctable symbol errors for the coding system then the error-locator 140 will also generate an error status signal at its output 141.

The syndrome generator 110 generates the syndrome values for each information block in the received sequence r. The syndrome values are a vector sum of the bits in the received parity symbols and parity-check digits which are recomputed by the syndrome generator 110 from the information in the received information sequence r. The number of computed syndrome values is equal to twice the number of symbol errors that the particular coding system was designed to correct. Computation of syndrome values is well known in the art. A general discussion of the computation and characteristics of syndrome values appears in Lin and Costello, Chap. 4.4, p. 98–103 and a particular discussion of syndrome value generation for Reed-Solomon code systems appears at Chap. 6.5, pp. 170–175.

Figure 3:
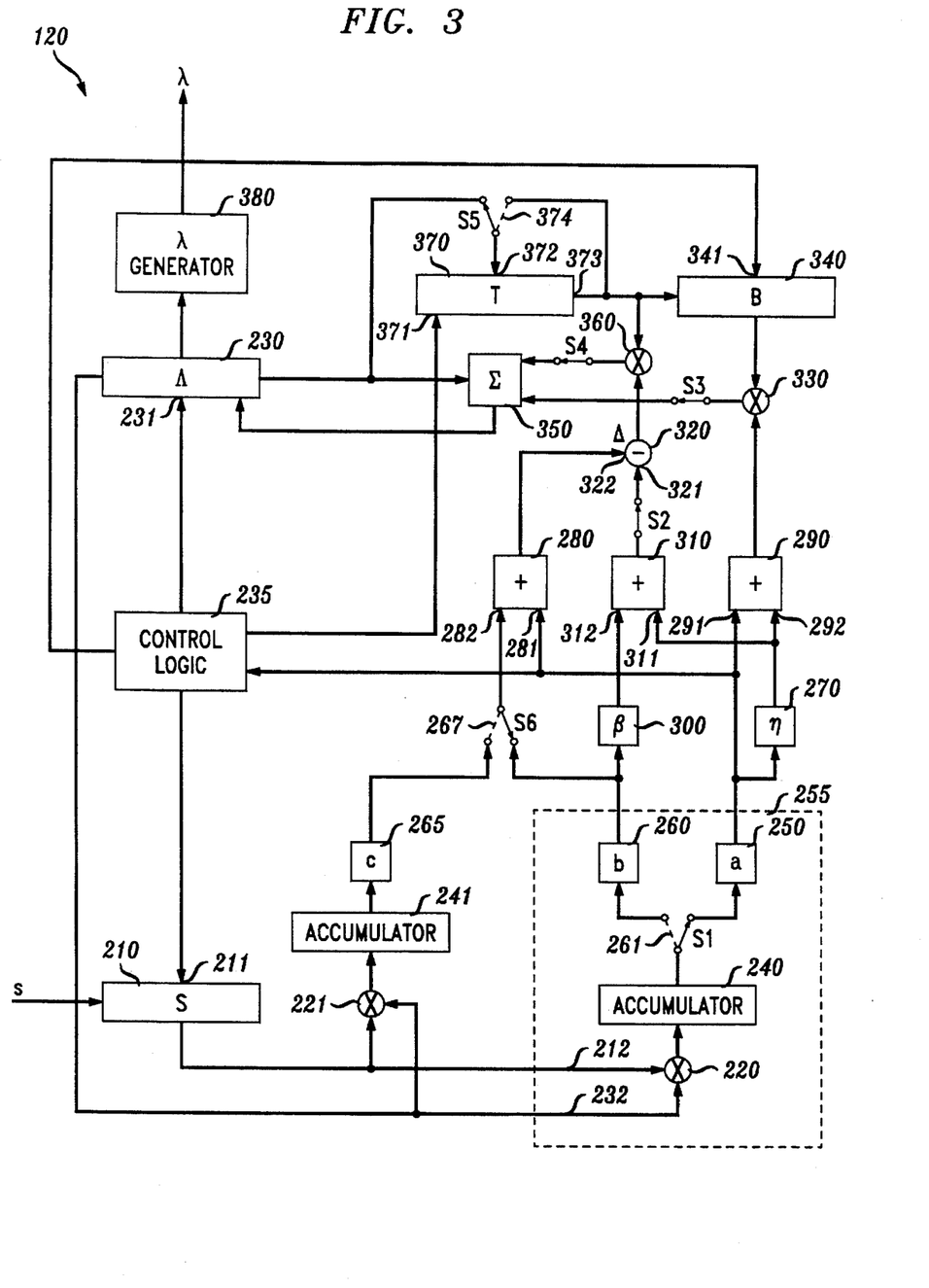
FIG. 3 is a schematic illustration of a reduced iteration error-detector circuit in FIG. 2.

The reduced iteration error-detector 120 detects the number of symbol errors occurring in each information block and computes the error-locator sequence Λ. In prior art channel decoders, the generation of an error-locator sequence Λ has required the most decoding processing time and complexity of all the functions of error detection, location and correction. One suitable reduced iteration error-detector circuit 120 according to the present invention which reduces decoding processing time is shown in FIG. 3 which is described below.

A common type of error-locator circuit 140 employs a Chien technique to determine the location of incorrect symbols. In the alternative, the error-locator 140 may solve the zeros of a polynomial corresponding to the error-locator sequence Λ in order to determine the particular locations of incorrect symbols. The error-corrector 130 may generate the proper symbol values for the particular identified incorrect symbols in each information block using a Forney technique which is well known in the art. A general discussion of common error-locator technique and error-corrector methods appears in Blahut, ch. 7.5, pp. 183–191.

Since digital sequences in coding systems have characteristics similar to polynomials, digital sequences may be represented as polynomial expressions. For example, a binary sequence C=1011, may be represented by $C(X)= (1)X^4+(0)X^3+ (1)X^2+(1)X=X^4+X^2+X$. The polynomial C(X) has an order of four because its first term has an exponent of four. A polynomial B(X) of order n is defined as:

$$B(X)=b_nX^n+b_{n-1}X^{n-1}+\ldots b_2X^2+b_1X.$$

When a sequence is shifted to the left by one, the coefficient at the lowest order position of the polynomial representation may either be filled by a one or a zero as denoted by the notation:

$$B_1(X)=b_nX^{n+1}+b_{n-1}X^n+\ldots +b_2X^3+b_1X^2+X$$

and $$B_0(X)=b_nX^{n+1}+b_{n-1}X^n+\ldots +b_2X^3+b_1X^2$$

When shifted by K positions with zeros in the K lowest coefficients, the polynomial is represented by:

$$B_0^K(X)=b_nX^{n+K}+\ldots +b_2X^{K+2}+b_1X^{K+1}$$

Thus, in the coding system described above, the error-locator sequence Λ can be represented by an error-locator polynomial $\Lambda(X)=\Lambda_nX^n+\Lambda_{n-1}X^{n-1}+\ldots +\Lambda_nX^1$.

Further, for the multiplication and summation of two information sequences: If $\Lambda=(\Lambda_1, \Lambda_2, \Lambda_3, \Lambda_4)$ and $S=(S_1, S_2, S_3, S_4)$ then $$\sum_{n=1}^{4} \Lambda_nS_{5-n} = \Lambda_1S_4 + \Lambda_2S_3 + \Lambda_3S_2 + \Lambda_4S_1$$

Figure 4:
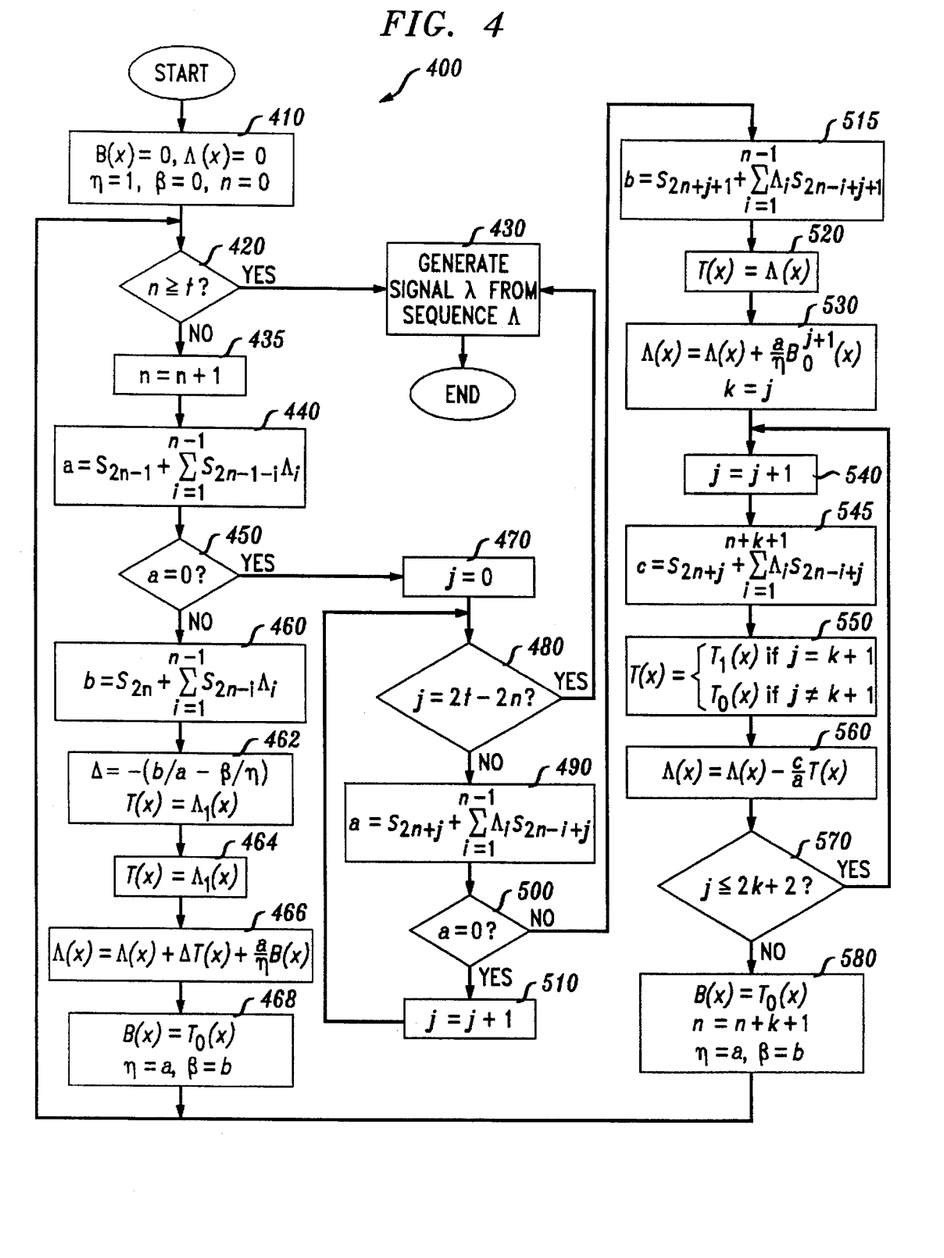
FIG. 4 is a flow diagram of the operation of the reduced iteration error-detector circuit in FIG. 3.

The above notation has been adopted in the discussion of digital information sequences in the description of the reduced iteration error-detector circuit 120 of FIG. 3 and a corresponding reduced iteration routine 400 of FIG. 4.

Referring to the error-detector circuit 120 of FIG. 3, a syndrome shift register 210 contains the syndrome values from the signal s received from the syndrome generator 110 of FIG. 2. The syndrome shift register 210 is connected to first and second multipliers 220 and 221 by a data line 212. The multipliers 220 and 221 are also connected to an error-locator shift register 230 by a data line 232. The multipliers 220 and 221 multiply the syndrome values provided by the syndrome shift register 210 with error-locator sequence values provided by the error-locator shift register 230. A control logic circuit 235 is connected to control inputs 211 and 231 of syndrome and error-locator shift registers 210 and 230 to control the order in which each of the syndrome and error-locator values are applied to the multipliers 220 and 221. The product values generated by the multipliers 220 and 221 are provided to the accumulators 240 and 241, respectively. Each of the accumulators 240 and 241 sequentially sums the received product values.

Figure 5:
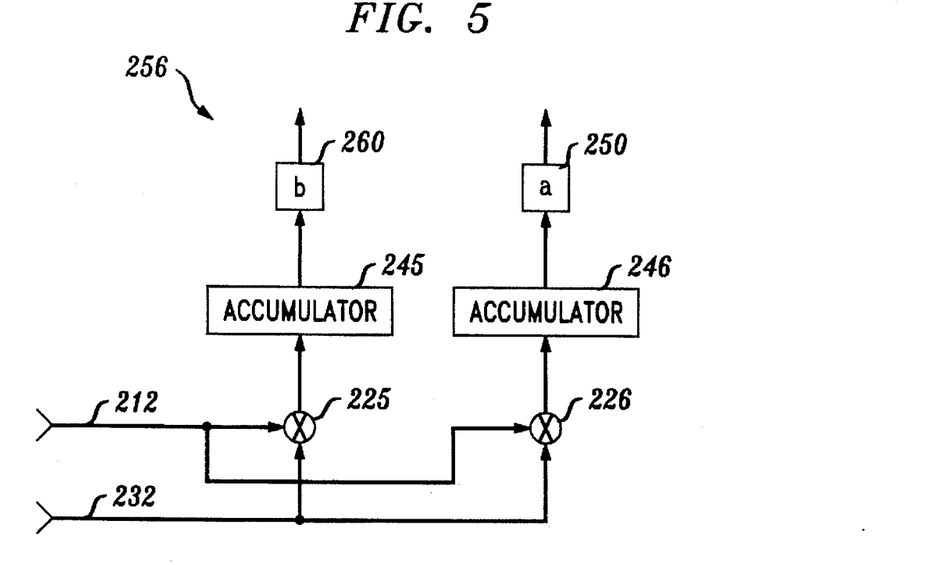
FIG. 5 is a schematic illustration of an alternative circuit configuration for the generation of current state error values in the circuit of FIG. 3.

The accumulator 240 is also connected to a switch S1. The switch S1 is connected to a first current state error register 250 and a second current state error register 260 which are used to maintain first and second current state error values, respectively. When switch S1 is in a first position, as shown in FIG. 3, the contents of the accumulator 240 will be directed to the register 250, or alternatively, when switch S1 is in a second position, as shown by a dashed-line 261 in FIG. 3, the contents of the accumulator 240 will be directed to the register 260. The circuit configuration utilized to generate the first and second current state error values is shown within a broken outline 255. An alternative circuit configuration 256 for generating the first and second current state error values is shown in FIG. 5 which is described below.

The summed value in accumulator 241 is provided to a third current state error register 265 which is used to maintain a third current state error value. The value maintained in the register 265 is provided to a switch S6 which is connected to a dividend input 282 of the first divider 280.

The register 250 provides the first current state error value to a first previous state error register 270, to a divisor input 281 of a first divider 280 and to a dividend input 291 of a second divider 290. The register 250 is also connected to the control logic circuit 235. The register 260 provides the second current state error value to a second previous state error register 300 and to the switch S6.

When switch S6 is in a first position, as shown in FIG. 3, the contents of the second current state error register 260 is provided to the first divider 280. In the alternative, when the switch S6 is in its second position, as shown by a dashed-line 267 in FIG. 3, the contents of the third current state error register 265 is provided to the first divider 280.

The register 270 provides a first previous state error value to divisor input 292 of the second divider 290 and to a divisor input 311 of a third divider 310. The register 300 is connected to a dividend input 312 of the third divider 310. The values contained in the registers 250, 260, 265, 270 and 300 will alternatively be referred to as values a, b, c, η and β, respectively.

The first divider 280 generates signals corresponding to the divided value b/a when the switch S6 is in its first position or the divided value c/a when the switch S6 is in its second position. The second and third dividers 290 and 310 generate signals corresponding to the divided values a/η and β/η, respectively. The divided value β/η of the third divider 310 is provided to a switch S2 which is connected to a subtrahend input 321 of a subtractor circuit 320. The switch S2 in a closed position, as shown in FIG. 3, directs the divided value β/η to the subtractor circuit 320 and in a open position, not shown in FIG. 3, the switch S2 does not provide the divided value to the subtractor circuit 320. The divided value b/a or c/a generated by the first divider 280 is applied to a minuend input 322 of the subtractor circuit 320. The subtractor circuit 320 generates a signal Δ corresponding to either the value −(b/a), −(c/a) or the value (β/η−b/a) depending on the positions of switches S2 and switch S6. Although the subtractor circuit 320 is capable of generating the signal corresponding to the value (β/η−c/a), This value is usually not required in the decoding operation.

The divided value a/η generated by the second divider 290 is applied to a multiplier 330 which is also connected to a intermediate iteration shift register 340 which contains values of an intermediate iteration sequence B. The control logic circuit 235 is connected to the control input 341 of the shift register 340 to direct which of the intermediate iteration values are to be applied to the multiplier 330. The multiplier 330 provides product values, which are represented by the polynomial notation (a/η)B(X), to a switch S3. The switch S3 is also connected to a summer 350 such that in a closed position of switch S3, as shown in FIG. 3, the product values represented by the polynomial expression (a/η)B(X) are applied to the summer 350, and in an open position of the switch S3, not shown in FIG. 3, such product values are not applied to the summer 350.

The signal Δ generated by the subtractor circuit 320 is applied to a multiplier 360 which is also connected to a previous state error-locator shift register 370. The shift register 370 contains values of a previous state error-locator sequence T. The control input 371 of the shift register 370 is connected to the control logic circuit 235 such that the control logic circuit 235 controls which values of the sequence T is to be provided to the multiplier 360. The multiplier 360 multiplies the signal Δ with each of the sequence values in the shift register 370 and directs the resulting product sequence to a switch S4. The product values generated by the multiplier 360 are alternatively represented in polynomial notation as ΔT(X).

In a closed position as shown in FIG. 3, the switch S4 applies the product values of the polynomial expression ΔT(X) to the summer 350. In an open position of switch S4, not shown in FIG. 3, the generated product values are not applied to the summer 350. The summer 250 also receives the error-locator sequence values stored in the shift register 230. The summer 350 sequentially generates new or updated values for the error-locator sequence by sequentially summing the current values of the error-locator sequence, the value (a/η)B(X) and the product values ΔT(X), when the switches S3 and S4 are in their closed positions. The sequentially generated new iterations of the values for the error-locator sequence are applied to the shift register 230.

The shift register 230 also provides the values of the sequence to a switch S5. The switch S5 connected to an input 372 and an output 373 of the shift register 370. The shift register output 373 is also connected to the shift register 340. Thus, the sequence values stored in the shift register 370 are applied to the shift register 340 and to the switch S5. In addition, a control input 371 of shift register 370 is connected to the control logic circuit 235.

The switch S5, when in a first position as shown in FIG. 3, directs the values of the sequence stored in the shift register 230 to the input 372 of the shift register 370. In a second position of the switch S5, shown as a dashed-line 374 in FIG. 3, the values stored in shift register 370 are applied back to the input 371 of the shift register 370. Setting switch S5 in its second position, permits the control logic circuit 235 to cause the previous state error-locator sequence contained in the shift register 370 to be updated as a shifted version of itself as described below with reference to FIG. 4.

The shift register 230 is also connected to a driver 380 which generates the signal λ upon the completion of the generation of the error-locator sequence contained in the shift register 230. The signal λ is applied to the error-corrector 130 and error-locator 140 of FIG. 2.

The control logic circuit 235 also controls the switches S1– S6 the circuit details of which are routine and are not shown for clarity and ease of illustration. The control circuit 235 controls the circuit 120 to perform the routine 400 of FIG. 4 and controls the shift registers 210, 230, 340 and 370 to provide the values of the respective sequences for processing in the particular order required by the routine 400. Further, the control logic circuit 235 provides all necessary timing operations of the circuit 120. The circuit 120 generates the error signal λ by deriving the error-locator sequence Λ according to the reduced iteration technique set out in the routine 400 of FIG. 4.

The operation of the reduced iteration error-detector circuit 120 in FIG. 3 will now be described with reference to FIG. 3 and to the corresponding routine 400 of FIG. 4. When new syndrome values are received by the syndrome shift register 210 in FIG. 3, the control logic circuit 235 initializes the shift registers 230, 340 and 300 to zero and the register 270 to unity as shown in step 410 of FIG. 4. Also in step 410, an error counter n contained in control logic circuit 235 is reset to zero.

The error counter n is then tested by the control logic circuit 235 in step 420 to determine if it is greater than or equal to the maximum number of correctable errors t for the particular Reed-Solomon code system. If the error counter n is greater than or equal to t, the routine 400 proceeds to step 430 where the driver 380 generates the signal λ based on the error-locator sequence contained in the shift register 230. On the other hand, if the error counter n is less than the maximum number of correctable errors t in step 420, the routine 400 proceeds to step 440. Since the maximum number of correctable errors t is typically greater than one, the routine 400 will usually proceed to step 440 after initialization in the processing of a newly received set of syndrome values.

In step 435, the error counter n is incremented and then in step 440, the first current state error value a is generated by setting the switch S1 to its first position. In generating the value a, the control logic circuit 235 controls the shift registers 210 and 230 such that the sequence values contained therein are provided to the accumulator 240 according to the expression:

$$a = S_{2n-1} + \sum_{i=1}^{n-1} S_{2n-1-i}\Lambda_i.$$

The generated value a in the accumulator 240 is then stored in the register 250.

The value a in the shift register 250 is then tested in step 450 by the control logic circuit 235 and if not equal to zero, the routine 400 computes the error-locator sequence values for the iteration by a first iterative method set out in steps 460– 468. However, if the value a is equal to zero in step 450, the routine 400 computes the error-locator sequence values for the iteration by a second iterative method set out in steps 470–580.

In the first iterative method set out in steps 460–468, the switch S1 is set to its second position in step 460 and the sequence values in the shift registers 210 and 230 are applied to the multiplier 220 in such an order so as to generate the value b in the accumulator 240 according to the expression:

$$b = S_{2n} + \sum_{i=1}^{n-1} S_{2n-i}\Lambda_i.$$

Also, in step 460, the switch S1 is set to its second position to cause the generated value b in the accumulator 240 to be supplied and stored in the register 260. Then in step 462, the switch S2 is set to its closed position and the switch S6 is set to its first position in order to cause the subtractor circuit 320 to generate the value $\Delta$ according to the expression: $\Delta=\beta/\eta-b/a$. Also in step 462, the shift register 370 is loaded with a shifted version of the sequence $\Lambda$ from the shift register 230 with a one in the lowest order position as represented by the polynomial notation $T(X)=\Lambda_1(X)$.

Then, in step 466, the values of the error-locator sequence $\Lambda$ for the particular iteration are generated by setting switches S3 and S4 in their closed positions such that the summer 350 produces the values of the error-locator sequence $\Lambda$ according to the polynomial expression $\Lambda(X)= \Lambda(X)+\Delta T(X)+(a/\eta)B(X)$. The produced sequence values are then stored in the shift register 230. The routine 400 then proceeds to step 468 where the shift register 340 is loaded with the values stored in the shift register 370 shifted one position with a zero entered in the lowest order position as represented by the polynomial notation $T_O(X)$. Also, in step 468, the registers 270 and 300 are loaded with the contents of the registers 250 and 260, respectively, to set the values $\eta=a$ and $\beta=b$. After completing step 468, the routine 400 reverts back to step 420 where the error counter n is tested against the maximum number of correctable errors t to either initiate the processing of the next iteration in step 440 or generation of the signal $\lambda$ in step 520.

The second iterative method is performed for a particular iteration in generating the error-locator sequence $\Lambda$ when the value a generated in step 440 is determined to be zero in step 450. The second iterative method starts, in step 470, by initializing a counter value j to zero. The counter value j is maintained in the logic control circuit 235. The counter value j is then tested in step 480, and if j=2 t–2 n, or in other words if the counter value j is equal to twice the difference between the maximum number of correctable errors t and the current error count n, the routine proceeds to step 430 where the signal $\lambda$ is generated and the routine 400 ends. However, in step 480, if j≠ 2 t–2 n, the routine 400 proceeds to step 490. In step 490, the control logic circuit 235 manipulates the values in the shift registers 210 and 230 so as to generate the value a in the accumulator 240 according to the equation:

$$a = S_{2n+j} + \sum_{i=1}^{n-1} S_{2n-i+j}\Lambda_i$$

Upon completion of the generation of the value a in the accumulator 240, the control logic circuit 235 sets switch S1 to its first position and the value a contained in the accumulator 240 is stored in the register 250.

Then, in step 500, the stored value a is tested by the control logic circuit 235 and if it is equal to zero, the counter value j is incremented in step 510 before the routine 400 reverts back to step 480 where the counter value j is again tested in order to generate the signal $\lambda$ in step 430 or a new value a in step 490. However, if in step 500, the value a is not equal to zero, the routine 400 proceeds to step 515.

In step 515, the control logic circuit 235 directs the shift registers 210 and 230 to provide the values of the syndrome sequence and the values of the current error-locator sequence to the multiplier 220 in a particular order such that the value b is generated in the accumulator 240 according to the expression:

$$b = S_{2n+j+1} + \sum_{i=1}^{n-1} \Lambda_i S_{2n-i+j+1}$$

The switch S1 is then set in its second position and the sum in the accumulator 240 is provided to the second current state error register 260. The switch S5 is then set in its first position in step 520 and the sequence values contained in the shift register 230 are loaded into the shift register 370 as represented by the polynomial notation $T(X)=\Lambda(X)$. Then, in step 530, switch S3 is set to its closed position and switch S4 is set to its open position such that the summer 350 generates the error-locator sequence values $\Lambda$ according to the polynomial expression $\Lambda(X)= \Lambda(X)+(a/\eta) B_O^{j+1}(X)$. The resulting generated sequence values are stored in the shift register 230. Also in step 530, a value k in the control logic circuit 235 is set to the counter value j.

The counter value j is then incremented in step 540 and the third current state error value c is generated in the accumulator 241 in step 545 according to the sequence expression:

$$c = S_{2n+j} + \sum_{i=1}^{n+K+1} \Lambda_i S_{2n-i+j}$$

The value c is stored in the register 265. Then, in step 550, the switch S5 is set in its second position and the shift register 370 is updated with a shifted version of its contents with either a zero or a one entered in the lowest order position according to the polynomial notation $T_1(X)$ if the value j=k+1, or $T_O(X)$ otherwise.

The error-locator values $\Lambda$ in the shift register 230 are then updated in step 560 according to the polynomial expression The error-locator values Λ in the shift register 230 are then updated in step 560 according to the polynomial expression Λ(X)=Λ(X)−(c/a)T(X). To accomplish the updating of the error-locator sequence values in step 560, the switches S2 and S3 are set in their open positions, the switch S4 is set in its closed position and the switches S5 and S6 are set in their second positions. After the contents of the memory 230 are updated in step 560, the counter value j is tested in step 570. In step 570, if the value j is greater than 2 k+2, the routine 400 proceeds to step 580, otherwise, the routine 400 reverts back to step 540 where a new value c is computed for the generation of new error-locator sequence values in the sequence of steps 540– 560.

In step 580, the shift register 340 is updated with a shifted version of the sequence in the shift register 370 with a zero entered in the lowest order position. Also in step 580, the error counter n is updated according to the expression n=n+k+1 and the registers 270 and 300 are updated with the contents of the registers 350 and 260, respectively, such that the values η= a and β=b. After completing step 580, the routine 400 reverts back to step 420 to begin a new iteration for the generation of the error-locator sequence values Λ.

In this manner, the circuit 120 of FIG. 3 performs the routine 400 of FIG. 4 and generates the error-locator sequence Λ and corresponding signal λ. It is readily understood by those skilled in the art, that there are various other circuit number of components used in the circuit 120, the multiplier 221 and accumulator may be removed, and the switch S1 may be substituted by a three-position switch to provide the summed contents of the accumulator 240 to either the registers 250, 260 or 265 in the manner required by the routine 400.

Although the circuit configuration 255 of FIG. 3 generates the current state error values a and b in a serial fashion, these values may be computed in a parallel manner to provide a further reduction in the decoding processing time. The circuit configuration 256 shown in FIG. 5 is a suitable alternative parallel circuit configuration which may be substituted for the serial circuit configuration 255 in FIG. 3. Like components of FIGS. 5 and 3 are numbered the same for clarity, such as the current state error registers 250 and 260 and the data lines 212 and 232. The outputs of the registers 250 and 260 in FIG. 5 are connected to the same circuit components as the registers 250 and 260 in FIG. 3.

Referring to FIG. 5, the data lines 212 and 232 from the registers 210 and 230, shown in FIG. 3, are connected to respective multipliers 225 and 226. The multipliers 225 and 226 multiply the sequence values on data lines 212 and 232, and provide the resulting product values to accumulators 245 and 246, respectively. The accumulators 245 and 246 sum the product values received from the multipliers 225 and 226, and provide the summed results to the first and second current state error registers 260 and 250, respectively. The summed results in the summed results to the first and second current state error registers 260 and 250, respectively. The summed results in the accumulators 245 and 246 which are provided to the registers 260 and 250 correspond to the first and second current state error values a and b, respectively.

The circuit configuration 256 permits the generation of the values a and b in a substantially simultaneously to provide the desired reduction in decoding processing time. It will be readily understood by those skilled in the art that the particular shift registers 210 and 230 employed to operate in conjunction with the circuit configuration 256 should possess the capabilities of providing two different shifted versions of their contents on the data lines 212 and 232 in the manner required by the reduced iteration routine 400 of FIG. 4.

A corresponding suitable modification may be made to the first iterative method of the routine 400 of FIG. 4. The suitable modification consists of simultaneously performing the computations of the values a and b of the steps 440 and 460 prior to performing the testing operation of step 450. By simultaneously generating the current state error values a and b in the first iterative method, an overall reduction in decoding processing time is achieved because from the point of view of processing time, the first iterative method is the predominant time constraint in a typical decoding operation.

Computer simulation of typical received encoded information blocks has revealed that the corresponding generated syndrome values when arranged into a syndrome matrix according to the Peterson-Gorenstein-Zierler equation will form a square matrix of order p. The arranged syndrome matrix and particular corresponding matrices are non-singular, i.e., the determinant of each of the matrices are not zero. Each of the particular corresponding matrices is generated by sequentially decrementing the order of a syndrome matrix such that the highest order row and column of a particular order matrix are not considered in generating the next lower order matrix. Thus, the particular corresponding matrices will be square matrices of the order p−1, p−2 . . . 1.

When a syndrome matrix possesses such characteristics, as will be the case for the vast majority of typical data, the corresponding first current state error values generated in the step 440 of the routine 400 are not zero and the iterative generations of the error-locator sequence Λ are performed by the first iterative method.

Figure 6:
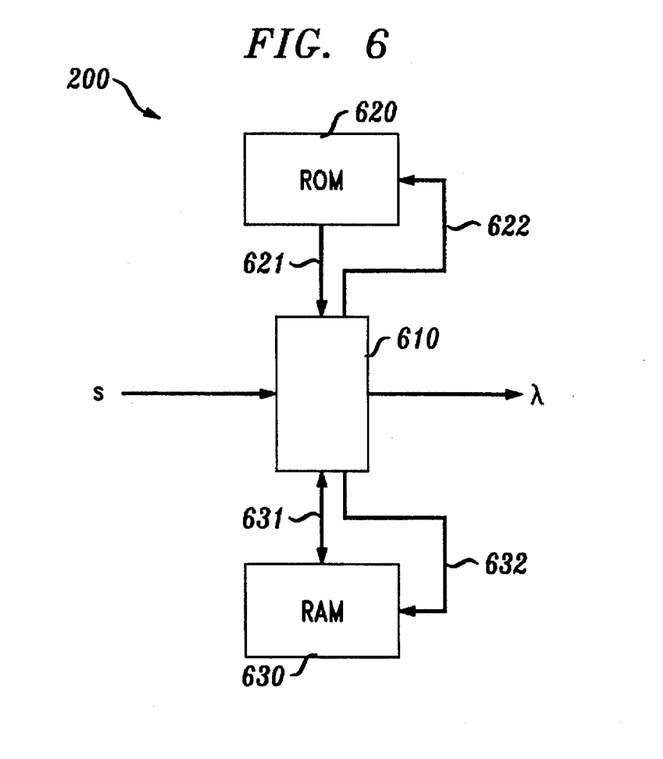
FIG. 6 is an alternative processing system to perform the operations of the reduced iteration error-detector circuit of FIG. 3.

FIG. 6 depicts a processing circuit 600 which is an alterative circuit suitable for generating the signal λ according the reduced iteration routine 400 of FIG. 4. A processing unit 610, such as a microprocessor or microcontroller, is adapted to receive the signal s from the syndrome generator 110 in FIG. 2. The processing unit 610 is connected to a non-volatile memory 620, such as a ROM, by a data line 621 and an address line 622 and to a volatile memory 630, such as a RAM, by a data line 631 and an address line 632. The processing unit 610 generates the error signal λ corresponding to the error-locator sequence Λ using a software program to perform the routine 400 of FIG. 4. The error signal λ generated by the processing unit 610 is provided to the error-corrector 130 and the error-locator 140 of FIG. 2.

Further, the use of more than one processing component in the processing unit 610 enables several of the steps in the reduced iteration routine 400 to be performed in a parallel manner, such as steps 440 and 460, which provides a reduction in the decoding processing time as described above with regard to FIG. 5.

The reduced iteration circuit and method of the present invention should not be limited to the decoding of Reed-Solomon encoded information and is equally applicable to decoding BCH encoded information. Further, it will be readily understood by those skilled in the art that the communication system 1 employing the channel decoder 70 according to the present invention depicted in FIG. 1 is functionally analogous for coding purposes to a data storage system, wherein the modulator 30 would be a writing unit, the transmission channel 40 would be a storage medium and the demodulator 60 would be a reading unit. Thus, the reduced iteration error detection circuit and method of the present invention should not be limited to a communication system and is applicable to data storage systems and to other applications where Reed-Solomon or BCH coding is utilized.

I claim:

1. A decoder for decoding a representation of an encoded information block containing data symbols, the decoder comprising:

a syndrome generator for receiving the representation of the coded information block and for generating a corresponding set of syndrome values;

an error detector for receiving the set of syndrome values and for generating an error-locator sequence based on the set of syndrome values and a determination of whether the syndrome values are capable of forming a syndrome matrix that is singular;

an error-locator for receiving the error-locator sequence and for generating a signal indicating positions of incorrect symbols within the information block based on the error-locator sequence; and an error corrector for receiving the set of syndrome values, the error-locator sequence and the signal indicating the positions of the incorrect symbols and for generating a decoded information signal.

2. The decoder of claim 1, wherein the error detector comprises:

means for maintaining the received set of syndrome values;

means for maintaining current state error-locator sequence values;

means for generating a first current state error value by multiplying the syndrome values and the error-locator sequence values in a particular order and summing the result;

means for generating a second current state error value by multiplying the syndrome values and the error-locator sequence values in a different particular order to that of the first current state error value and summing the result;

means for generating a third current state error value by multiplying the syndrome values and the error-locator sequence values in a different particular order to that of the first and second current state error values and summing the result;

means for generating a first previous state error value based on the first current state error value;

means for generating a second previous state error value based on the second current state error value;

means for generating a first intermediate value by dividing the second current state error value by the first current state error value;

means for generating a second intermediate value by dividing the first current state error value by the first previous state error value;

means for generating a third intermediate value by dividing the second previous state error value by the first previous state error value;

means for generating a fourth intermediate value by subtracting the first intermediate value by the third intermediate value;

means for generating a fifth intermediate value by dividing the third current state error value by the first current state error value;

means for maintaining intermediate iteration sequence values;

means for maintaining previous state error-locator sequence values;

means for generating first product values by multiplying the values of the intermediate sequence by the second intermediate value;

means for generating second product values by selectively multiplying the values of the previous state error-locator sequence by the first, fourth, or fifth intermediate value;

means for generating new current state error-locator sequence values by selectively adding the first product values, the second product values, the previous state error-locator sequence values and the values in the current state error-locator maintaining means;

a signal generating means for generating a signal based on the contents of the current state error-locator maintaining means; and control means to control the operations of the reduced iteration error-locator sequence generator.

3. The decoder of claim 2, wherein the means for generating the first and second current state error values are the same means.

4. The decoder of claim 2, wherein the means for generating the first and second current state error values perform their operations at substantially the same time.

5. The decoder of claim 1, wherein the error detector comprises:

a syndrome shift register for receipt of the set of syndrome values;

an error-locator shift register for maintaining the error-locator sequence values;

means for generating first, second and third current state error values, the error values generating means being connected to the syndrome shift register and the error-locator shift register;

a first current state error register connected to the error values generating means;

a second current state error register connected to the error values generating means;

a third current state error register connected to the error values generating means;

a first previous state error register connected to the first current state error register;

a second previous state error register connected to the second current state error register;

a first means for generating a value corresponding to a value in the second current state error register divided by a value in the first current state error register;

a second means for generating a value corresponding to a value in the third current state error register divided by a value in the first current state error register;

a second divider for generating a value corresponding to the value in the first current state error register divided by a value in the first previous state error register;

a third divider for generating a value corresponding to a value in the second previous state error register divided by the value in the first previous state error register;

a subtractor having an output and a minuend and subtrahend inputs, the minuend input being adaptable to receive the value generated by the first or second means;

a first switch having an input and an output, and operating in either a closed or open position, the input receiving the value generated by the third divider and the output being connected to the subtrahend input of the subtractor, wherein when the first switch is in its closed position the value at the output of the subtractor corresponds to the value generated by the first means subtracted by the value generated the third divider, and when the first switch is in its open position the value at the subtractor output corresponds to the value generated by the first or second means;

a first multiplier having an output and first and second inputs, the first input being connected to the subtractor output;

a second switch having an input and an output, and operating in either a closed or open position, the input being connected to the output of the first multiplier;

a second multiplier having an output and first and second inputs, the first input receiving the value generated by the second divider;

an intermediate iteration shifter register connected to the second input of the second multiplier;

a third switch having an input and an output, and operating in either a closed or open position, the input being connected to the output of the second multiplier;

a summer having first, second and third inputs and an output, the first input being connected to the second switch output, wherein when the second switch is in its closed position, a value at the first multiplier output is applied to the first input of the summer and when in an open position the first multiplier output is not connected to the summer input, the second summer input being connected to the third switch output, wherein when the third switch is in its closed position, a value at the second multiplier output is applied to the second input of the summer and when in an open position the second multiplier output is not connected to the summer input, and the third summer input and the summer output being connected to the error-locator shift register;

a previous state error-locator shift register connected to the second input of the second multiplier and the intermediate iteration shift register;

a fourth switch having an output and first and second inputs, and operating in either a first or second switch position, the first input and output being connected to the previous state error-locator shift register and the second input being connected to the error-locator shift register, such that in a first position of the fourth switch, the previous state error register can be loaded with a shifted version of its contents, and in a second position of the fourth switch, the previous state error register can be loaded with the contents of the error-locator shift register;

a control logic circuit connected to the error values generating means, the first and second means, the switches, the shift registers, the accumulator and the first current state error register, the control logic circuit controlling the operations of the reduced-iteration error-locator sequence generator; and a signal generator connected to the error-locator shift register for generating a signal corresponding the generated error-locator sequence values.

6. The decoder of claim 5, wherein the means for generating the first, second and third current state error values comprises:

a multiplier;

an accumulator connected to the first multiplier;

a switch operating in either first, second or third positions and having an input and first, second and third outputs, the input of the switch being connected to the accumulator, wherein the multiplier is connected to the syndrome and error-locator shift registers and the first, second and third switch outputs are connected to the respective first, second and third current state error registers such that in the first position, the switch connects the accumulator to the first current state error register and in the second position, the switch connects the accumulator to the second current state error register and in the third position, the switch connects the accumulator to the third current state error register.

7. The decoder of claim 5, wherein the means for generating the first, second and third current state error values comprises:

first, second and third multipliers;

first, second and third accumulators connected to the first, second and third multipliers, respectively, wherein the first, second and third multipliers are each connected to the syndrome and error-locator shift registers and wherein the first, second and third accumulators are connected to the first, second and third current state error registers, respectively.

8. The decoder of claim 5, wherein the means for generating the first, second and third current state error values comprises:

first and second multipliers;

first and second accumulators connected to the first and second multipliers, respectively;

a switch operating in either first or second positions and having an input and first and second outputs, the input of the switch being connected to the first accumulator, wherein the first and second multipliers are connected to the syndrome and error-locator shift registers and the first and second switch outputs are connected to the respective first and second current state error registers such that in the first position, the switch connects the accumulator to the first current state error register and in the second position, the switch connects the accumulator to the second current state error register, and the second accumulator is connected to the third current state error register.

9. The decoder of claim 1, wherein the encoded information blocks are Reed-Solomon coded information blocks.

10. The decoder of claim 1, wherein the encoded information blocks are BCH coded information blocks.

11. The decoder of claim 1, wherein the decoder operates on encoded information transmitted in a communication system.

12. The decoder of claim 1, wherein the decoder operates in a data storage system.

13. A reduced iteration error-locator sequence generator for receiving signals containing syndrome sequence values based on encoded data and generating a signal corresponding to an error-locator sequence, the generator comprising:

means for maintaining the received set of syndrome values;

means for maintaining current state error-locator sequence values;

means for generating a first current state error value by multiplying the syndrome values and the error-locator sequence values is a particular order and summing the result;

means for generating a second current state error by multiplying the syndrome values and the error-locator sequence values in a different particular order to that of the first current state error value and summing the result;

means for generating a third current state error by multiplying the syndrome values and the error-locator sequence values in a different particular order to that of the first and second current state error values and summing the result;

means for generating a first previous state error value based on the first current state error value;

means for generating a second previous state error value based on the second current state error value;

means for generating a first intermediate value by dividing the second current state error value by the first current state error value;

means for generating a second intermediate value by dividing the first current state error value by the first previous state error value;

means for generating a third intermediate value by dividing the second previous state error value by the first previous state error value;

means for generating a fourth intermediate value by subtracting the first intermediate value by the third intermediate value;

means for generating a fifth intermediate value by dividing the third current state error value by the first current state error value;

means for maintaining intermediate iteration sequence values;

means for maintaining previous state error-locator sequence values;

means for generating first product values by multiplying the values of the intermediate sequence by the second intermediate value;

means for generating second product values by selectively multiplying the values of the previous state error-locator sequence by the first, fourth or fifth intermediate value;

means for generating new current state error-locator sequence values by selectively adding the first product values, the second product values, the previous state error-locator sequence values and the values in the current state error-locator maintaining means;

a signal generating means for generating a signal based on the contents of the current state error-locator maintaining means; and control means to control the operations of the reduced iteration error-locator sequence generator.

14. The error-locator sequence generator of claim 13, wherein the means for generating the first and second current state error values are the same means.

15. The error-locator sequence generator of claim 13, wherein the means for generating the first and second current state error values perform their operations at substantially the same time.

16. A method for decoding a representation of encoded information which is organized into a coded information block containing data symbols, the method comprising the steps of:

generating a set of syndrome values S based on the coded information;

generating an error signal λ corresponding to an error-locator sequence Λ based on the set of syndrome values S and a determination of whether the syndrome values are capable of forming a syndrome matrix that is singular;

generating a signal indicating positions of incorrect symbols within the information block based on the error-locator sequence; and generating a decoded information signal based on the set of syndrome values, the error-locator sequence and the signal indicating the positions of incorrect symbols.

17. The method of claim 16, wherein the step of generating the error signal λ comprises the steps of:

performing successive iterations of a procedure, each iteration of the procedure includes incrementing an error counter n and generating a first current state error value a according to a first method, wherein:

$$a = S_{2n-1} + \sum_{i=1}^{n-1} S_{2n-1-i} \Lambda_i;$$

generating the error-locator sequence Λ according to a first iterative method, if the value a is not equal to zero;

generating a new first current state error value a and error-locator sequence Λ according to a second iterative method if the value a is equal to zero; and generating the error signal λ if the incremented error counter n is greater than or equal to a value t, wherein the value t represent a particular maximum number of symbol errors that the encoding of the information is designed to correction.

18. The method of claim 17, wherein the first iterative method comprises the steps of:

generating the error-locator sequence Λ according to the polynomial expression: Λ(X)=Λ(X)+ΔT(X)+(a/η)B(X), wherein Δ=−(b/a−β/η), T is a previous state error-locator sequence, B is an intermediate iteration sequence and $$b = S_{2n} + \sum_{i=1}^{n-1} S_{2n-i} \Lambda_i;$$

and updating the previous state error-locator sequence values T to the current error-locator sequence values Λ shifted by one with a one inserted at a lowest order position.

19. The method of claim 17, wherein the second iterative method comprises:

successively regenerating the first current state error value a by the expression:

$$a = S_{2n+j} + \sum_{i=1}^{n-1} S_{2n-i+j} \Lambda_i,$$

wherein a counter j is initially zero and incremented for each regeneration until either the value a is not equal to zero or j is equal to 2 t−2 n;

generating the error, signal if the counter j is equal to 2 t−2 n upon completion of the regeneration of the value a;

generating new error locator values if the regenerated value a is not equal to zero, wherein intermediate counter k is initialized to the counter j and the previous state error-locator sequence is initialized to equal the error-locator sequence and the second current state error value b and the error-locator sequence Λ are initialized according to the polynomial expressions:

$$b = S_{2n+j+1} + \sum_{i=1}^{n-1} \Lambda_i S_{2n-i+j+1}$$

-continued $$\Lambda(X) = \Lambda(X) + (a/\eta) B_0^{j+1}(X),$$

and wherein the error-locator sequence for the iteration is successively generated by the expression:

$$\Lambda(X)=\Lambda(X)-(c/a) T(X),$$

wherein $$c = S_{2n+j} + \sum_{i=1}^{n+k+1} S_{2n-i+j}\Lambda_i,$$

and wherein $T(x)=T_1(X)$ if the counter $j=k+1$, otherwise $T(X)= T_O(X)$, and wherein the counter j is incremented before each generation, and ending the generation of the error-locator sequence for the iteration when the counter j is greater than 2 k+2; and upon generation of the error-locator sequence $\Lambda$ for the iteration, the error counter n is set to n+k+1; and the intermediate iteration sequence B is set to the previous state error-locator sequence shifted by one with a zero inserted at a lowest order position and the first and second previous state error values are updated with the first and second current state error values, respectively.

20. The method of claim 18, further comprising:

performing the generation of the first and second current state error values a and b in a substantially parallel manner.

21. The method of claim 16, wherein the encoded information is Reed-Solomon coded information.

22. The method of claim 16, wherein the encoded information is BCH coded information.

23. A reduced iteration method for generating error signals corresponding to error-locator sequence values $\Lambda$ in response to received signals containing syndrome sequence values S corresponding to transmitted encoded Reed-Solomon coded information blocks designed to correct a maximum of t errors, the iteration method comprising the steps of:

performing successive iterations of a procedure, each iteration of the procedure includes incrementing an error counter n and generating a first current state error value a according to a first method, wherein:

$$a = S_{2n-1} + \sum_{i=1}^{n-1} S_{2n-1-i}\Lambda_i.$$

generating the error-locator sequence $\Lambda$ according to a first iterative method and if the value a is not equal to zero;

generating a new first current state error value a and error-locator sequence values $\Lambda$ according to a second iterative method, if the value a is equal to zero, ending the iterations and generating the error signals if the incremented error counter n is greater than or equal to the maximum correctable errors t, wherein the first iterative method comprises:

generating the error-locator sequence $\Lambda$ according to the polynomial expression:

$$\Lambda(X)=\Lambda(X)+\Delta T(X)+(a/\eta)B(X),$$

wherein $\Delta=-(b/a-\beta/\eta)$, T is a previous state error-locator sequence and B is an intermediate iteration sequence, $$b = S_{2n} + \sum_{i=1}^{n-1} S_{2n-i}\Lambda_i,$$

and setting the previous state error-locator sequence values T to the current error-locator sequence values $\Lambda$ shifted by one with a one inserted at a lowest order position upon completion of the generation of the error-locator sequence, and wherein the second iterative method comprises:

successively regenerating the first current state error value a by the expression:

$$a = S_{2n+j} + \sum_{i=1}^{n-1} S_{2n-i+j} \Lambda_i$$

with a counter j starting from zero and incrementing for each regeneration until either the value a is not equal to zero or the counter j is equal to 2 t–2 n; and generating the error signal if the counter j is equal to 2 t–2 n upon completion of the regeneration of the value a, or generating the error-locator sequence values $\Lambda$ for the iteration if the value a is not equal to zero, the error-locator sequence values are generated by initializing a value k to the value of the counter j and the previous state error-locator sequence to the error-locator sequence and initializing the second current state error value b and the error-locator sequence $\Lambda$ according to the expressions:

$$b = S_{2n+j+1} + \sum_{i=1}^{n-1} \Lambda_i S_{2n-i+j+1}$$

$$\Lambda(X) = \Lambda(X) + (a/\eta) B_0^{j+1} (X),$$

and successively generating the error-locator sequence for the iteration by the polynomial expression $$\Lambda(X)=\Lambda(X)-(c/a) T(X),$$

wherein $$c = S_{2n+j} + \sum_{i=1}^{n+k+1} S_{2n-i+j} \Lambda_i,$$

and wherein $T(x)=T_1(X)$ if the counter $j=k+1$, otherwise $T(x)= T_O(X)$, and wherein the counter j is incremented before each generation, ending the generation of the error-locator sequence for the iteration when the counter j is greater than 2 k+2, and upon completion of the generation of the error-locator sequence $\Lambda$ for the iteration, the error counter n is set to n+k+1, the intermediate iteration sequence B is set to the previous state error-locator sequence shifted by one with a zero inserted at a lowest order position and the first and second previous state error values are updated with the first and second current state error values, respectively.

24. The method of claim 23, further comprising:

generating the first and second current state error values a and b in the first iterative method a substantially parallel manner.

25. A reduced iteration error-locator sequence generator for receiving signals containing syndrome sequence values S based on encoded data and generating an error signal corresponding to an error-locator sequence $\Lambda$, the generator comprising:

means for performing successive iterations of a procedure in the generation of the error-locator sequence values Λ;

a first means for generating the error-locator sequence values Λ for an iteration according to a first iterative technique;

a second means for generating the error-locator sequence values Λ for an iteration according to a second iterative technique;

selection means for determining whether the first or second error-locator generator sequence means is to be used for a particular iteration; and means for generating the error signal.

26. The generator of claim 25, wherein the selection means comprises:

means for producing a signal corresponding to a current state error value a based on the polynomial expression:

$$a = S_{2n-1} + \sum_{i=1}^{n-1} S_{2n-1-i} \Lambda_i;$$

and means for testing the produced value a and selecting the first iterative means if the value a is not equal to zero or selecting the second iterative means if the value a is equal to zero.

27. The generator of claim 25, wherein the first iterative means comprises:

means for deriving the error-locator sequence Λ according to an expression:

$$\Lambda(X) = \Lambda(X) + \Delta T(X) + (a/\eta) B(X),$$

wherein the value Δ is equal to $\Delta = -(b/a - \beta/\eta)$, and the value b is equal to $$b = S_{2n} + \sum_{i=1}^{n-1} S_{2n-i} \Lambda_i.$$

and wherein T is a previous state error-locator sequence, and B is an intermediate iteration sequence; and means for updating the previous state error-locator sequence values T to the current error-locator sequence values Λ shifted by one with a one inserted at a lowest order position.

28. The generator of claim 25, wherein the second iterative means comprises:

means for successively regenerating the first current state error value a by the expression:

$$a = S_{2n+j} + \sum_{i=1}^{n-1} S_{2n-i+j} \Lambda_i$$

with a counter j is set to zero and incremented for each regeneration until either the value a is not equal to zero or the counter j is equal to 2 t–2 n;

means for controlling the generating means to generate the error signal if the resulting counter j is equal to 2 t–2 n;

means for generating the error-locator sequence values if the resulting value a is not equal to zero, wherein the error-locator sequence value generation means includes means for initializing an intermediate counter k to the counter j and the previous state error-locator sequence T to the current error-locator sequence Λ and initializing the second current state error value b and the error-locator sequence Λ according to the expressions:

$$b = S_{2n+j+1} + \sum_{i=1}^{n-1} \Lambda_i S_{2n-i+j+1}$$

$$\Lambda(X) = \Lambda(X) + (a/\eta) B_0^{j+1} (X);$$

and means for successively producing the values of the error-locator sequence Λ for the iteration by the expression $$\Lambda(X) = \Lambda(X) - (c/a)T(X)$$

wherein $$c = S_{2n+j} + \sum_{i=1}^{n+k+1} S_{2n-i+j} \Lambda_i,$$

and $T(x) = T_1(X)$ if the counter $j=k+1$, otherwise $T(x)=T_O(X)$, and wherein the counter j is incremented before each generation, means for ending the error-locator sequence Λ generation when the value of the counter j is greater than the value 2 k+2; and means for setting error counter n to n+k+1 after the error locator sequence has been generated.

29. The method of claim 16 wherein the step of generating the error signal λ comprises:

determining whether the syndrome values are capable of forming a syndrome matrix that is singular;

performing a first iterative method to generate the error locator sequence if it is determined that the syndrome values are capable of forming a syndrome matrix that is singular; and performing a second iterative method to generate the error locator sequence if it is determined that the syndrome values are capable of forming a non-singular syndrome matrix.

\* \* \* \* \*